United States Patent
Liu et al.

(10) Patent No.: US 9,338,915 B1
(45) Date of Patent: May 10, 2016

(54) METHOD OF ATTACHING ELECTRONIC MODULE ON FABRICS BY STITCHING PLATED THROUGH HOLES

(71) Applicant: Flextronics AP, LLC, Broomfield, CO (US)

(72) Inventors: Weifeng Liu, Dublin, CA (US); Anwar Mohammed, San Jose, CA (US); Zhen Feng, San Jose, CA (US)

(73) Assignee: Flextronics AP, LLC, Broomfield, CO (US)

(*) Notice: Subject to any disclaimer, the term of this patent is extended or adjusted under 35 U.S.C. 154(b) by 0 days.

(21) Appl. No.: 14/228,021

(22) Filed: Mar. 27, 2014

Related U.S. Application Data

(60) Provisional application No. 61/913,830, filed on Dec. 9, 2013.

(51) Int. Cl.
| | | |
|---|---|---|
| *H05K 1/16* | (2006.01) | |
| *H05K 1/18* | (2006.01) | |
| *H05K 3/30* | (2006.01) | |
| *H05K 7/02* | (2006.01) | |
| *H05K 3/10* | (2006.01) | |

(52) U.S. Cl.
CPC .. *H05K 7/02* (2013.01); *H05K 1/18* (2013.01); *H05K 3/10* (2013.01); *H05K 3/30* (2013.01)

(58) Field of Classification Search
CPC ....... H05K 1/111; H05K 1/112; H05K 1/115; H05K 1/117; H05K 1/023; H05K 1/16; H05K 1/18; H05K 1/181; H05K 3/30; H05K 3/405; H05K 3/42; H05K 2201/09545; H05K 2201/09981; H05K 2201/0287; H01L 23/14

USPC ............. 174/250–268; 361/760, 792–795; 29/832, 852

See application file for complete search history.

(56) References Cited

U.S. PATENT DOCUMENTS

| | | | |
|---|---|---|---|
| 3,471,434 A | 10/1969 | Iles | |
| 5,555,915 A | 9/1996 | Kanao | |
| 5,778,941 A | 7/1998 | Inada | |
| 6,103,971 A | 8/2000 | Sato et al. | |
| 6,192,940 B1 | 2/2001 | Koma et al. | |
| 6,307,751 B1 | 10/2001 | Bodony | |
| 6,711,024 B1 | 3/2004 | Johansson | |
| 7,019,973 B2 | 3/2006 | Rivera | |
| 7,156,127 B2 | 1/2007 | Moulton et al. | |
| 7,494,238 B2 * | 2/2009 | Kuo | F21V 33/0008 362/103 |
| 7,735,523 B2 | 6/2010 | Smith et al. | |
| 2002/0076948 A1 * | 6/2002 | Farrell | B32B 5/02 438/800 |
| 2003/0098084 A1 | 5/2003 | Ragner et al. | |
| 2003/0111126 A1 | 6/2003 | Moulton et al. | |
| 2004/0229533 A1 | 11/2004 | Braekevelt et al. | |
| 2005/0022338 A1 | 2/2005 | Muhlenkamp | |
| 2006/0128346 A1 | 6/2006 | Yasui | |
| 2007/0089800 A1 | 4/2007 | Sharma | |
| 2008/0258314 A1 * | 10/2008 | Yoo | H01L 23/14 257/784 |

(Continued)

*Primary Examiner* — Ishwarbhai B Patel
(74) *Attorney, Agent, or Firm* — Haverstock & Owens LLP

(57) ABSTRACT

A wearable electronics assembly includes one or more electronic modules coupled to a wearable electronics fabric. Each of the one or more electronic modules includes one or more plated through holes, through each of which is coupled an electrically conductive wire. The electrically conductive wire is stitched through the plated through hole and to a fabric onto which the electronic module is attached. The electronic module can include one or more electronic components coupled to a printed circuit board.

12 Claims, 2 Drawing Sheets

(56) References Cited

U.S. PATENT DOCUMENTS

| | | | |
|---|---|---|---|
| 2008/0271220 A1* | 11/2008 | Chilton | A41D 1/002 2/69 |
| 2010/0117537 A1 | 5/2010 | Horppu et al. | |
| 2010/0199901 A1 | 8/2010 | Kang et al. | |
| 2010/0325770 A1* | 12/2010 | Chung | D02G 3/36 2/69 |
| 2011/0119812 A1* | 5/2011 | Genz | F21V 33/0008 2/244 |
| 2011/0198118 A1 | 8/2011 | Fang et al. | |
| 2014/0124257 A1 | 5/2014 | Yoshihara | |

* cited by examiner

METHOD OF ATTACHING ELECTRONIC MODULE ON FABRICS BY STITCHING PLATED THROUGH HOLES

RELATED APPLICATIONS

This Patent Application claims priority under 35 U.S.C. 119 (e) of the U.S. Provisional Application, Ser. No. 61/913,830, filed Dec. 9, 2013, and entitled "METAL FABRIC STITCHING AND STRETCHABLE BATTERIES". This application incorporates U.S. Provisional Application, Ser. No. 61/913,830 in its entirety by reference.

FIELD OF THE INVENTION

The present invention is generally directed to the field of wearable electronics. More specifically, the present invention is directed to wearable electronics fabric having an electronic module with electrical connectivity provided by stitched electrically conductive wire.

BACKGROUND OF THE INVENTION

Electronic devices are increasingly being developed so as to be worn by a user, such as in wearable electronics. Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

SUMMARY OF THE INVENTION

Embodiments of a wearable electronics assembly are directed to one or more electronic modules coupled to a wearable electronics fabric. Each of the one or more electronic modules includes one or more plated through holes, through each of which is coupled an electrically conductive wire. The electrically conductive wire is stitched through the plated through hole and to a fabric onto which the electronic module is attached. The electronic module can include one or more electronic components coupled to a printed circuit board. In some embodiments, the fabric is a wearable electronics fabric having one or more insulated wires woven into the fabric. In some embodiments, the insulated wire includes an inner metal wire and an outer insulation layer. The electrically conductive wire stitched to the fabric and through the plated through hole can also be electrically coupled to the metal wire within the insulated wire of the fabric. In some embodiments, the wearable electronics fabric is clothing, such as a shirt or pants, or other form to be worn by a user, such as an armband, waistband, hat or shoes.

In an aspect, an electronics assembly is disclosed that includes a fabric, an electronics module and an electrically conductive wire. The electronics module is coupled to the fabric. The electronics module includes a substrate and a plated through hole formed through the substrate. The plated through hole forms an electrical connection point. The electrically conductive wire passes through the plated through hole and is stitched to the fabric such that an electrical connection is formed between the electrically conductive wire and the electrical connection point. In some embodiments, the electrically conductive wire is stitched through a first portion of the fabric exposed at the plated through hole and is stitched through a portion of the fabric proximate a perimeter edge of the substrate. In some embodiments, the electrically conductive wire passes through the plated through hole and loops over the perimeter edge of the substrate. In some embodiments, the plated through hole includes a plated side wall. In some embodiments, the plated through hole includes a plated top edge. In some embodiments, the plated through hole includes a plated surface that extends over a top surface of the substrate. In some embodiments, the electronics assembly also includes an encapsulation layer coupled to the electronics module and the electrically conductive wire. In some embodiments, the electronics module includes a printed circuit board and one or more electronic components coupled to the printed circuit board, further wherein the printed circuit board includes the substrate and the electrical connection point. The printed circuit board can include one or more electrically conductive interconnects, and the electrical connection point can be coupled to one of the one or more electrically conductive interconnects. In some embodiments, the printed circuit board is a single layer printed circuit board. In other embodiments, the printed circuit board is a multiple layer printed circuit board. In some embodiments, the fabric includes an insulated wire including an inner metal wire and an outer insulation layer, further wherein the electrically conductive wire is electrically coupled to the inner metal wire of the insulated wire. In some embodiments, the electrically conductive wire stitched to the fabric includes two separate wires, wherein the two separate wires include a metal wire and an insulation wire. In some embodiments, the electronics assembly is wearable.

In another aspect, a method of making an electronics assembly is disclosed. The method includes fabricating an electronics module and attaching the electronics module to a fabric. The electronics module includes a substrate and plated through hole formed through the substrate, and the plated through hole forms an electrical connection point. The method also includes stitching an electrically conductive wire to the fabric through the plated through hole such that an electrical connection is formed between the electrically conductive wire and the electrical connection point. In some embodiments, the electrically conductive wire is stitched through a first portion of the fabric exposed at the plated through hole and is stitched through a portion of the fabric proximate a perimeter edge of the substrate. In some embodiments, the electrically conductive wire passes through the plated through hole and loops over the perimeter edge of the substrate. In some embodiments, fabricating the electronics module including the plated through hole includes forming a through hole through the substrate and plating a side wall of the through hole. In some embodiments, fabricating the electronics module including the plated through hole includes forming a through hole through the substrate and plating a top edge of the through hole. In some embodiments, fabricating the electronics module including the plated through hole includes forming a through hole through the substrate and plating a top surface of the substrate proximate the through hole. In some embodiments, the method also includes adding an encapsulation layer coupled to the electronics module and the electrically conductive wire. In some embodiments, the electronics module includes a printed circuit board and one or more electronic components coupled to the printed circuit board, wherein the printed circuit board includes the substrate and the electrical connection point. In some embodiments, the printed circuit board also includes one or more electrically conductive interconnects, and the electrical connection point is coupled to one of the one or more electrically conductive interconnects. In some embodiments, the fabric includes an insulated wire including an inner metal wire and an outer insulation layer, and the method also includes electrically coupling the electrically conductive wire to the inner metal wire of the insulated wire. In some embodiments, the electrically conductive wire stitched to the fabric includes two separate wires, wherein the two separate wires include a metal wire and an insulation wire, and stitching the electrically conductive wire to the fabric includes stitching the two separate wires. In some embodiments, the electronics assembly is wearable.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an electronics module coupled to a fabric and methods of attaching the electronics module to the fabric. Those of ordinary skill in the art will realize that the following detailed description of the products and methods are illustrative only and is not intended to be in any way limiting. Other embodiments of the products and methods will readily suggest themselves to such skilled persons having the benefit of this disclosure.

Reference will now be made in detail to implementations of the products and methods as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
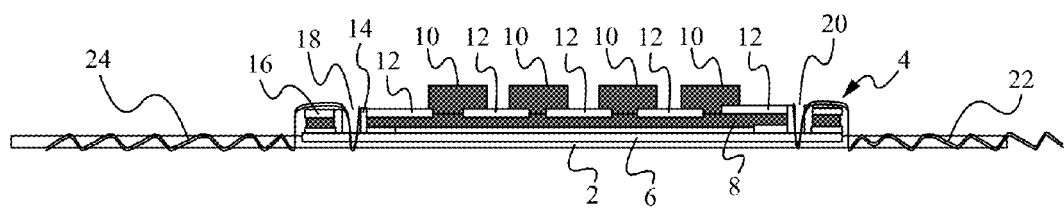
FIG. 1 illustrates a cut out side view of an electronic module coupled to a fabric according to an embodiment.

FIG. 1 illustrates a cut out side view of an electronic module coupled to a fabric according to an embodiment. As used herein, the term "fabric" generally applies to cloth or other similar materials made of threads, fibers, filaments or the like, generally referred to herein as "threads". Materials used for threads can include, but are not limited to, cotton, wool, nylon, polyester or other synthetic materials. An electronic module 4 is coupled to the fabric 2. In some embodiments, the electronic module 4 is coupled to the fabric by an adhesive 6. The adhesive can be any conventional adhesive sufficient to adhere an electronics module to a fabric, such as an epoxy or glue.

In some embodiments, the electronic module 4 includes one or more electronic components 10 coupled to a printed circuit board 8. The electronic components 10 can be any conventional electronic components including, but not limited to, active electronic components such as integrated circuits, passive electronic components such as resistors, capacitors and inductors, power supplies, and other components typically connected to printed circuit boards. A printed circuit board substrate can be made of conventional printed circuit board substrate material including, but not limited to, a thin flexible circuit, a rigid laminate substrate, or a ceramic substrate. The printed circuit board 8 can be a single layer board or multiple layer board. The exemplary printed circuit board 8 in FIG. 1 is a multiple layer board. The printed circuit board 8 includes electrically conductive interconnects 12 that provide, in part, interconnects between electronic components 10. Interconnects can be provided on the top surface and/or the bottom surface of the printed circuit board. Additionally, interior layers in a multiple layer printed circuit board can include interconnects and inter-layer connections can be provided by vias. The interconnects can also include pads designed to provide connection points off-board.

Off-board electrical connectivity can be provided using plated through holes in the printed circuit board, such as plated through hole 18 and plated through hole 20. In the exemplary configuration shown in FIG. 1, the plated through holes 18 and 20 are positioned proximate a perimeter edge of the printed circuit board 8. It is understood that the printed circuit board can include more or less than two plated through holes, and that plated through holes can be alternatively positioned on the printed circuit board then that shown in FIG. 1.

Each of the plated through holes 18 and 20 are plated with an electrically conductive material. In some embodiments, the plated through hole is first plated with copper, then plated with one or more different finishes to protect the copper from environment conditions and to ensure good electrical connection. Examples of such plated finishes include, but are not limited to, gold flash with nickel, silver, tin lead solder, pure tin and lead free solder. In some embodiments, the side walls of the plated through hole are plated, such as side walls 14. In other embodiments, a top edge of the plated through hole is plated, where the top plating extends from a perimeter edge of the plated through hole along a top surface of the printed circuit board 8. In this configuration, the top plating can extend to the edge or over the edge of the plated through hole and partially onto the side wall. The top plating can extend laterally away from the plated through hole in any direction along the top surface of the printed circuit board, including to the perimeter edge of the printed circuit board, such as a top plating 16. In still other embodiments, the plating of the plated through hole can include both plating to the entire side wall and the top plating as described above. In some embodiments, a bottom plating can be formed along a bottom of the surface of the printed circuit board. The plating of the plated through hole is coupled to an interconnect 12 to form an electrical connection.

Stitched electrically conductive wire 24 is stitched to the fabric 2. The stitched electrically conductive wire 24 passes through the plated through hole 18 and is stitched to the fabric 2 underneath the plated through hole 18. The stitched electrically conductive wire 24 loops over a top edge of the plated through hole 18 and off the perimeter edge of the printed circuit board 8 and is stitched to the fabric 2 proximate to the perimeter edge of the printed circuit board 8. The force of the stitched electrically conductive wire 24 against the plating of the plated through hole 18 forms an electrical connection between the stitched electrically conductive wire 24 and the plating of the plated through hole 18.

In some embodiments, a diameter of each plated through hole is in the millimeter range, for example between about a few millimeters to sub-millimeter. In general, the plated through hole is configured with a diameter that is large enough to enable a stitching needle to pass within the plated through hole and reach the fabric beneath. Although each plated through hole 18 and 20 are shown in FIG. 1 to be circular, it is understood that the plated through holes can be alternatively shaped. The stitched electrically conductive wire 24 is coupled to the plated through hole 18 and to the fabric 2 with sufficient force to provide an electrical connection between the plating of the plated through hole 18 and the stitched electrically conductive wire 24.

In some embodiments, the stitched electrically conductive wire 24 is stitched using any conventional stitching process that uses two threads. In this case, the stitched electrically conductive wire 24 includes two wires, a first wire is electrically conductive and a second wire, a bobbin wire, is electrically insulated so that the two wires do not short together. In some embodiments, the first wire is made of electrically conductive material such as metal, carbon fiber, nylon wire coated with silver finish, or metal particles embedded polymer wire. Examples of metal wire include, but are not limited to, copper, silver, steel or their alloys. The metal wire can also be coated with different finishes such as gold flash over nickel, silver or solder. In some embodiments, the second wire is made of electrically insulated material such as nylon or polyester. It is understood that alternative electrically conductive materials can be used for the first wire and alternative electrically insulated materials can be used for the second wire. For simplicity, the stitched electrically conductive wire is generally referred to herein as being electrically conductive, even in those configurations where a second insulated wire is used in the stitching process.

The plated through hole 20 can be plated in a manner similar to that described above in relation to plating of the plated through hole 18. The area, shape, proportions, material, electrical connections to interconnects on the printed circuit board and other characteristics can be the same, similar or different from one plated through hole to another, dependent on the specific requirements of each plated through hole.

Stitched electrically conductive wire 22 is stitched to the fabric 2. The stitched electrically conductive wire 22 passes through the plated through hole 20 and is stitched to the fabric 2 underneath the plated through hole 20. The stitched electrically conductive wire 22 loops over a top edge of the plated through hole 20 and off the perimeter edge of the printed circuit board 8 and is stitched to the fabric 2 proximate to the perimeter edge of the printed circuit board 8. The force of the stitched electrically conductive wire 22 against the plating of the plated through hole 20 forms an electrical connection between the stitched electrically conductive wire 22 and the plating of the plated through hole 20.

FIG. 1 shows the adhesive 6 positioned on the fabric 2 underneath the bottom opening of the plated through hole 18 and the opening of the plated through hole 20. Alternatively, the opening of the plated through hole 18 and the opening of the plated through hole 20 can be clear of adhesive 6 so that the stitched electrically conductive wire 22 and the stitched electrically conductive wire 24 are stitched directly to the fabric 2. This can be achieved by reducing the area covered by the adhesive 6. In some embodiments, the adhesive is applied such that none of the stitched electrically conductive wire passes through adhesive.

Figure 2:
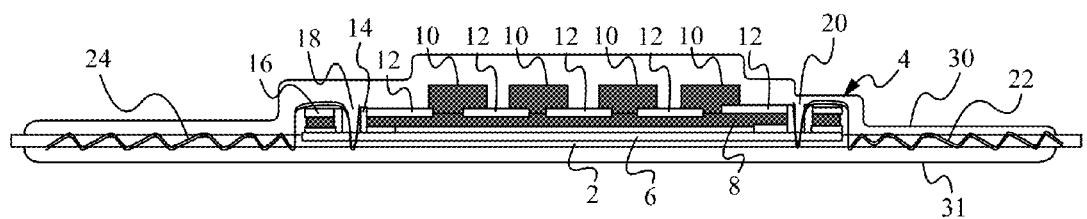
FIG. 2 illustrates the electronic module of FIG. 1 including an encapsulation layer.

In some embodiments, an encapsulation layer is added over the electronic module 4 and the stitched electrically conductive wires 22 and 24, such as an encapsulation layer 30 shown in FIG. 2. A backside encapsulation layer is also added over the stitched electrically conductive wires 22 and 24 on the backside of the fabric 2, such as backside encapsulation layer 31. In some embodiments, the encapsulation layer is an elastic material, such as an elastic polymer, or elastomer, which is a polymer with viscoelasticity. It is understood that alternative elastic substrates can be used including, but not limited to, silicone, urethane, latex and spandex, also referred to as elastane. The encapsulation layer provides environmental protection as well as electrical isolation of individual electrical connection points and wires.

Figure 3:
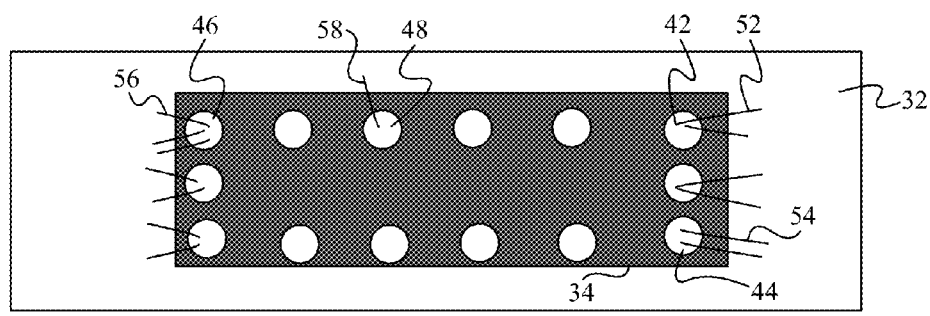
FIG. 3 illustrates a top down view of another exemplary electronic module coupled to a fabric.

The number and positions of the plated through holes on the printed circuit board varies by application. In some embodiments, the plated through holes are positioned proximate the perimeter edge of the printed circuit board so as to minimize the distance that the stitched electrically conductive wire loops over the printed circuit board. This also maximizes the remaining area on the printed circuit board for alternative functionality. It is understood that plated through holes can be positioned on portions of the printed circuit board other than proximate the perimeter edge. One or more metal foils can extend laterally from the printed circuit board in any direction. One or more stitches can be used to stitch electrically conductive wire to any given plated through hole. FIG. 3 illustrates a top down view of another exemplary electronic module 34 coupled to a fabric 32. For simplicity, the details of the electronic module 34 are not shown. Various plated through holes are positioned along a perimeter edge of the electronic module 34. The number and placement of electrically conductive wire stitches per plated through hole can vary. For example, plated through hole 42 has two electrically conductive wire stitches 52 arranged in a non-linear configuration, whereas plated through hole 44 has two electrically conductive wire stitches 54 arranged in a linear configuration. Plated through hole 46 has three electrically conductive wire stitches 56, and plated through hole 48 has a single electrically conductive wire stitch 58.

In some embodiments, the fabric includes one or more insulated wires intermixed with the fabric threads. An example of a fabric having intermixed insulated wires is found in the co-pending U.S. patent application Ser. No. 14/194,497, titled "Magnet Wire for Wearable Electronics Fabric", which is hereby incorporated in its entirety by reference. In some embodiments, the insulated wire includes an inner metal wire and an outer insulation layer. In some embodiments, the electrically conductive wire stitched through the plated through hole is also electrically coupled to the metal wire within the insulated wire of the fabric. Any conventional means can be used to electrically couple the electrically conductive wire to the metal wire within the insulated wire.

As used herein, the term "intermix" generally refers to mixing or blending together and is applied herein to describe the manner by which an insulated wire, such as a magnet wire, is integrated as part of a fabric. The magnet wire is intermixed with the fabric using conventional methodologies, for example weaving, stitching, felting or knitting, and is intended to include, but not be limited to, such similar concepts as intertwining, interweaving, interspersing, interlacing, intermingling and the like of the magnet wire and fabric threads.

Magnet wire is typically made of a copper or aluminum wire coated with a very thin layer of insulation. Magnet wire is referred to as "magnet" due to its electromagnetic applications. Magnet wires can be used in the construction of transformers, inductors, motors, speakers, hard disk head actuators, potentiometers, electromagnets, and other applications which require tight coils of wire. The metal wire itself is most often fully annealed, electrolytically refined copper. Smaller diameter magnet wire usually has a round cross section. An example of this kind of wire is used for things such as electric guitar pickups. Thicker magnet wire is often square or rectangular with rounded corners to provide more current flow per coil length.

In some embodiments, magnet wire includes one to four layers of polymer film insulation, often of two different compositions, to provide a tough, continuous insulating layer. Materials used for magnet wire insulating films can include, but are not limited to, polyvinyl formal (Formvar™), polyurethane, polyamide, polyester, polyester-polyimide, polyamide-polyimide (or amide-imide), and polyimide. Polyimide insulated magnet wire is capable of operation at up to 250° C. In other embodiments, different types of insulation are used including, but not limited to, fiberglass yarn with varnish, aramid paper, kraft paper, mica, and polyester film. It is understood that are types of magnet wires can be used, for example a silver wire having various insulators, such as polytetrafluoroethylene (Teflon™), such as that found in the audio industry. For ease of manufacturing, newer magnet wires can have insulation that acts as a flux when burnt during soldering. This results in magnet wires having electrical connections at the ends that can be made without stripping off the insulation first. Older magnet wires do not have this type of insulation and can require sandpapering or scraping to remove the insulation before soldering.

Figure 4:
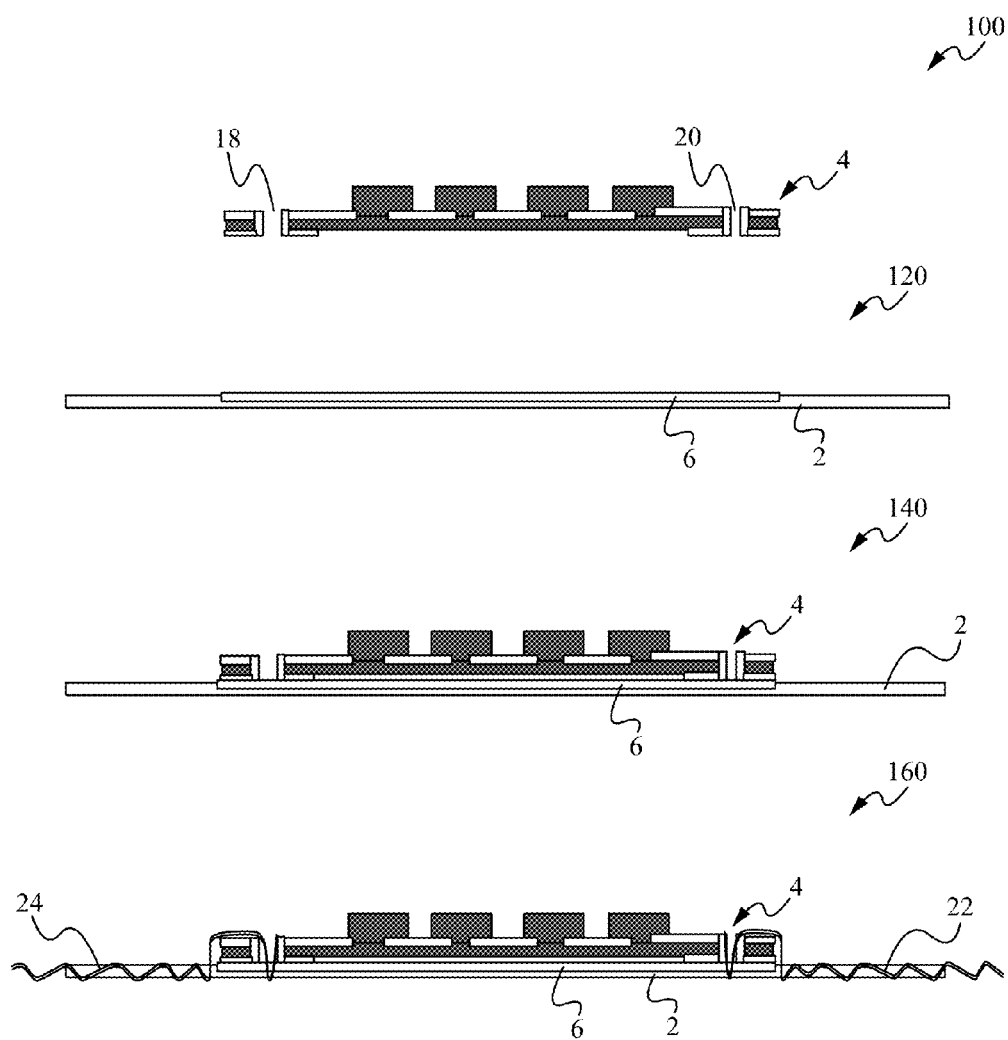
FIG. 4 illustrates a method of fabricating an electronic module having plated through holes and coupling the electronic module to a fabric according to an embodiment.

There are various methodologies for forming the electronics module with plated through holes stitched to the fabric. FIG. 4 illustrates a method of fabricating an electronic module having plated through holes and coupling the electronic module to a fabric according to an embodiment. At the step 100, the electronic module 4 is fabricated. In the exemplary embodiment shown in FIG. 4, the electronic module 4 is the same as the electronic module 4 shown in FIG. 1 including the plated through holes 18 and 20 positioned proximate the perimeter edge of the printed circuit board. It is understood that the electronic module can be alternatively configured. In some embodiments, the electronic module 4 is fabricated using conventional printed circuit board fabrication and SMT (surface mount technology) processes. Each layer of the printed circuit board is made using conventional substrate material, such as a laminate. The electronic module 4 is designed and fabricated having certain plated through holes that will be subsequently used to form electrical connections with stitched electrically conductive wire. Any number of plated through holes can be deigned and fabricated for use as such electrical connections. Any conventional plating process can be used to plate the plated through holes.

At the step 120, the adhesive 6 is applied to the fabric 2 where the electronic module is to be attached. In some embodiments, the adhesive is selectively applied to the fabric so that no adhesive is present where the plated through holes are positioned. At the step 140, the electronic module 4 from the step 100 is attached to the fabric 2 via the adhesive 6. In some embodiments, a curing step is performed to secure the electronic module 4 to the adhesive 6.

At the step 160, the electrically conductive wire 22 is stitched to the fabric 2 and the electrically conductive wire 24 is stitched to the fabric 124. An optional additional step can be performed where the stitched metal wire 22 is electrically coupled to an insulated wire (not shown) intermixed in the fabric 2, and the stitched metal wire 24 is electrically coupled to another insulated wire (not shown) intermixed in the fabric 2. Another optional additional step can be performed where an encapsulation layer, such as the encapsulation layers 30 and 31 in FIG. 2, is added over the electronic module 4 and the stitched electrically conductive wires 22 and 24.

The exemplary configurations described above are directed to a single electronic module coupled to the fabric. It is understood that alternative configurations are configured that include more than one electronic module coupled to the fabric. In such embodiments, the stitched metal wire can be used to connect multiple electronic modules, or to intervening insulated wires woven into the fabric, which in turn may be electrically coupled to other electronic modules via stitched metal wires.

Although embodiments of the electronics assembly are described above as wearable electronics assembly, the general concepts described herein can be applied generally to electronics coupled to fabrics, wearable or otherwise.

The present application has been described in terms of specific embodiments incorporating details to facilitate the understanding of the principles of construction and operation of the products and methods. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronics assembly comprising:
   a fabric;
   an electronics module coupled to the fabric, wherein the electronics module includes a printed circuit board comprising a laminate substrate, a plated through hole formed through the laminate substrate, an electrically conductive interconnect electrically coupled to the plated through hole and an electronic component electrically coupled to the electrically conductive interconnect, further wherein the plated through hole forms an electrical connection point on the laminate substrate; and
   an electrically conductive wire passing through the plated through hole and stitched to the fabric such that an electrical connection is formed between the electrically conductive wire and the electrical connection point.

2. The electronics assembly of claim 1 wherein the electrically conductive wire is stitched through a first portion of the fabric exposed at the plated through hole and is stitched through a portion of the fabric proximate a perimeter edge of the laminate substrate.

3. The electronics assembly of claim 2 wherein the electrically conductive wire passes through the plated through hole and loops over the perimeter edge of the laminate substrate.

4. The electronics assembly of claim 1 wherein the plated through hole comprises a plated side wall.

5. The electronics assembly of claim 1 wherein the plated through hole comprises a plated top edge.

6. The electronics assembly of claim 1 wherein the plated through hole comprises a plated surface that extends over a top surface of the laminate substrate.

7. The electronics assembly of claim 1 further comprising an encapsulation layer coupled to the electronics module and the electrically conductive wire.

8. The electronics assembly of claim 1 wherein the printed circuit board comprises a single layer printed circuit board.

9. The electronics assembly of claim 1 wherein the printed circuit board comprises a multiple layer printed circuit board.

10. The electronics assembly of claim 1 wherein the fabric comprises an insulated wire including an inner metal wire and an outer insulation layer, further wherein the electrically conductive wire is electrically coupled to the inner metal wire of the insulated wire.

11. The electronics assembly of claim 1 wherein the electrically conductive wire stitched to the fabric comprises two separate wires, wherein the two separate wires comprise a metal wire and an insulation wire.

12. The electronics assembly of claim 1 wherein the electronics assembly is wearable.

\* \* \* \* \*